United States Patent [19]

Hayward et al.

[11] 4,214,264

[45] Jul. 22, 1980

[54] HYBRID COLOR IMAGE SENSING ARRAY

[75] Inventors: John S. Hayward, Rochester; Benjamin B. Snavely, Fairport; Pin S. Tschang, Rochester, all of N.Y.

[73] Assignee: Eastman Kodak Company, Rochester, N.Y.

[21] Appl. No.: 15,973

[22] Filed: Feb. 28, 1979

[51] Int. Cl.$^2$ .................... H04N 9/07; H01L 27/14
[52] U.S. Cl. ........................ 358/44; 358/48; 357/24; 357/30
[58] Field of Search .............. 358/44, 43, 41, 48, 358/213; 357/24, 30; 250/211 J, 211 R

[56] References Cited

U.S. PATENT DOCUMENTS

| | | | |
|---|---|---|---|
| 3,717,724 | 2/1973 | Montgomery | 358/43 |
| 3,860,959 | 1/1975 | Kubo et al. | 358/44 |
| 3,971,065 | 7/1976 | Bayer | 358/41 |
| 4,047,203 | 9/1977 | Dillon | 358/44 |

FOREIGN PATENT DOCUMENTS 2811961 9/1978 Fed. Rep. of Germany ............. 358/44

OTHER PUBLICATIONS

"Color Responsive CCD Images", *Research Disclosure*, Aug. 1978, vol. 172, Disclosure No. 17240.

*Primary Examiner*—John C. Martin
*Attorney, Agent, or Firm*—Thomas H. Close

[57] ABSTRACT

A hybrid color image sensing array includes: (a) an array of semiconductor image sensing elements, each element having superposed upper and lower light responsive channels for producing first and second photosignals, the intrinsic spectral responses of the channels being different due to the differential absorption of light by a semiconductor material; and (b) an array of color filter elements disposed over the array of image sensing elements, the array of filter elements having: (1) elements of a first relative transmittance type adapted to tailor the spectral responses of an image sensing element such that the photosignals produced by the element possess a component representing the response of the element to light in a first preferred spectral region and a component representing the response of the element to light in a second spectral region, and (2) elements of a second relative transmittance type adapted to tailor the spectral responses of the image sensing element such that the photosignals produced by the element possess a component representing the response of the element to light in the first spectral region and a component representing the response of the element to light in a third spectral region.

Known matrixing procedures are employed to separate a relatively high resolution first signal and relatively lower resolution second and third signals from the photosignals produced by the hybrid color image sensing array.

14 Claims, 16 Drawing Figures

FILTERED CHANNEL SPECTRAL SENSITIVITIES

— UPPER CHANNEL W/CYAN FILTER
--- LOWER CHANNEL W/CYAN FILTER
— — UPPER CHANNEL W/ YELLOW FILTER
····· LOWER CHANNEL W/YELLOW FILTER

HYBRID COLOR IMAGE SENSING ARRAY

BACKGROUND OF THE INVENTION

1. Field of the Invention

The invention relates to solid-state color image sensors, and more particularly to a technique for producing a plurality of color signals from a single image sensing array.

2. Discussion Relative to the Prior Art

It is a well-recognized goal to produce a plurality of color signals from a single solid-state image sensing array. Solid-state color image sensors are known wherein panchromatic image sensing elements in an array are selectively sensitized to color by means of an integral array of color filters disposed over the array of image sensing elements. Highly efficient configurations for such filter arrays that maximize the amount of usuable image information, based on human visual acuity for color detail, have been described in U.S. Pat. No. 3,971,065, issued July 20, 1976 to Bayer and U.S. Pat. No. 4,047,203, issued Sept. 6, 1977 to Dillon. The inherent resolution capabilities of such arrays are limited not only by the number of image sensing elements that can be manufactured in the array, but also by the fact that only a portion of the elements in the array contributed to the resolution of fine detail. Consequently, the spatial resolution of such integral-filter color image sensing arrays, while optimized for the particular design, will not be as high as a monochrome image sensing array of the same number of elements.

Recently, a solid-state color image sensing array has been developed having a potential resolution equal to that of a monochrome array of the same size. This array is based on a novel image sensing element having a plurality of superposed channels (e.g. three superposed channels for a three color device), each channel having a different spectral response due to the differential absorption of light by a semiconductor material. Such an array is disclosed in Research Disclosure August 1978, Vol., 172, Disclosure No. 17240 entitled "Color Responsive CCD Imager", available from Industrial Opportunities, Ltd., Homewell, Havant, Hampshire P09 1EF, UK. Although this approach represents a major breakthrough in improving the resolution of a solid-state color image sensing array, the manufacture of the multiple superposed channels for a three color array is complicated, requiring the formation of three superposed channels in the device. In addition, more information may be produced by such an array than can be efficiently utilized by a human viewer, since the spatial resolution in each of the basic colors is essentially equal. Thus, it is an object of the present invention to provide a solid-state color image sensing array that possesses the best features of both the approaches outlined above, i.e. a solid-state color image sensing array capable of producing a color signal having a spatial resolution equal to that produced by a monochrome array of comparable size, and sharing the relative simplicity and color sampling efficiency of an integral-filter color image sensing array.

SUMMARY OF THE INVENTION

The invention provides a color imaging device which achieves highly efficient color image sampling, considering human visual acuity characteristics, and possesses the desirable high resolution of the multiple superposed channel devices, using a superposed channel structure that is simpler than the triple superposed channel three color imaging devices.

According to the invention, a hybrid color image sensing array includes: (a) an array of semiconductor image sensing elements, each element having superposed upper and lower light responsive channels for producing first and second photosignals, the intrinsic spectral responses of the two channels being different due to the differential absorption of light by a semiconductor material; and (b) an array of color filter elements disposed over the array of image sensing elements, the array of filter elements having (1) elements of a first relative transmittance type adapted to tailor the spectral responses of an image sensing element such that the photosignals produced by the element possess a component representing the response of the element to light in a first preferred spectral region and a component representing the response of the element to light in a second spectral region, and (2) elements of a second relative transmittance type adapted to tailor the spectral responses of an image sensing element such that the photosignals produced by the element possess a component representing the response of the element to light in the first spectral region and a component representing the response of the element to light in a third spectral region.

According to the preferred embodiment of the invention, the hybrid sensing array for color imaging includes an array of image sensing elements, each element having a first channel possessing a first predetermined spectral response to blue, green and red wavelengths of light to generate a first photosignal, and a buried channel disposed beneath the first channel, possessing a second predetermined spectral response that is substantially less than the first channel response to blue, substantially similar to green, and substantially greater to red. An array of yellow and cyan subtractive color filter elements is disposed over the array of photosensing elements. The first photosignal from an element disposed beneath a yellow filter primarily represents green information, the second photosignal from such an element representing green plus red information. The first photosignal from an element disposed beneath a cyan filter represents blue plus green information, the second photosignal from such an element representing primarily green information. Known matrixing techniques are employed to separate a relatively high resolution green and relatively lower resolution red and blue color signals from the output signals of the hybrid color image sensing array.

BRIEF DESCRIPTION OF THE DRAWINGS

The invention will be described in detail with reference to the drawings, wherein.

DESCRIPTION OF THE PREFERRED EMBODIMENTS

Figure 1:
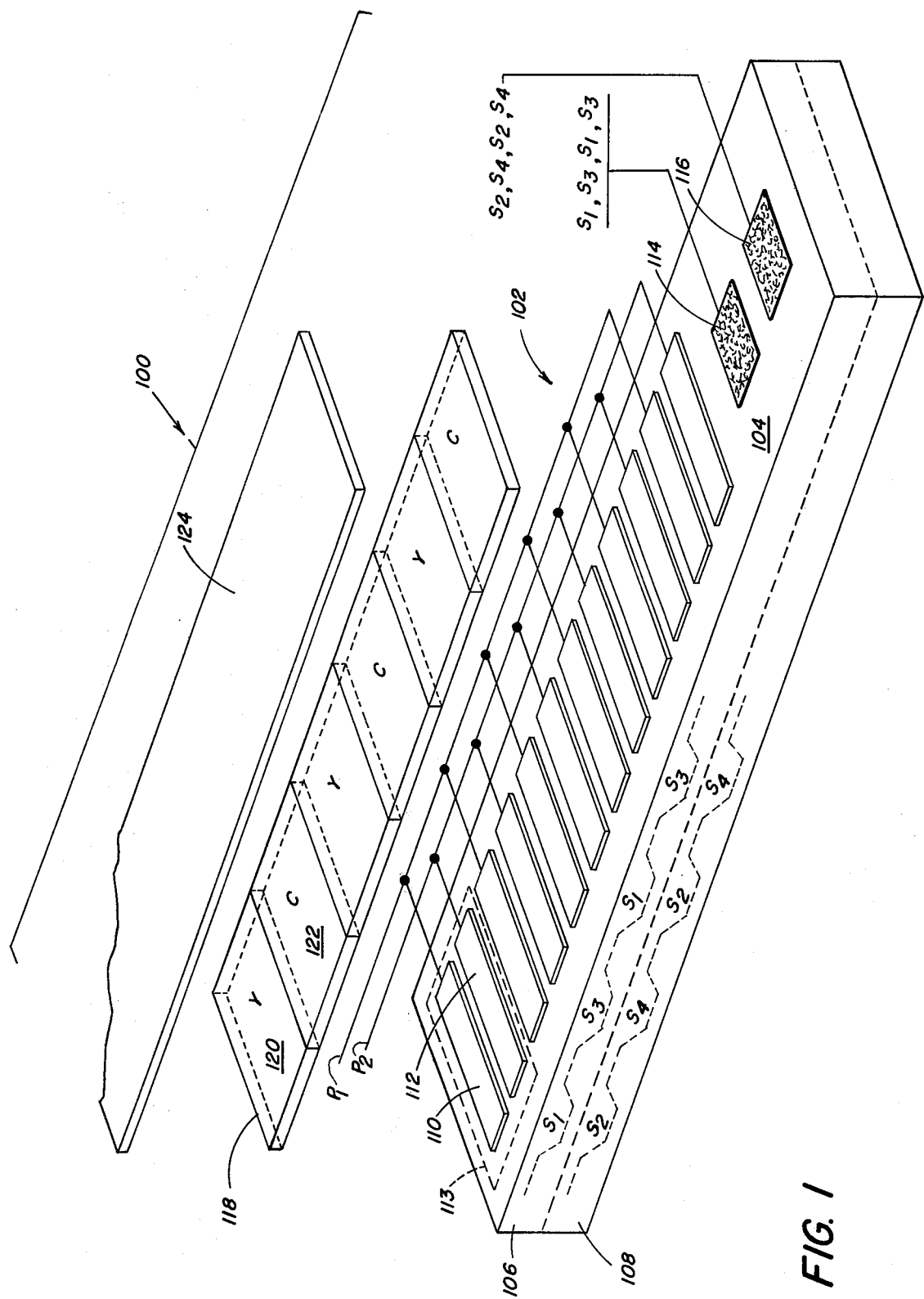
FIG. 1 is a schematic perspective view of a hybrid photosensing array according to the present invention.

FIG. 1 schematically illustrates the features of a hybrid color image sensor according to the present invention. The image sensor, which is generally designated 100, includes a dual-superposed-channel charge transfer device 102 having a light receiving surface 104, an upper light responsive channel 106, and a lower light responsive channel 108. The channels are merely shown schematically in FIG. 1; actual semicondcutor structure for implementing the channels will be further described in the examples disclosed below. A linear array of interdigitated first and second phase transparent transfer electrodes, 110 and 112, respectively, are provided on the surface of the semiconductor device to implement simultaneous transfer of charges within the upper and lower channels. A two phase charge transfer device is shown for ease of description. It is to be understood that three phase or four phase devices could also be constructed according to the invention. The configuration of the two phase transfer electrodes 110 and 112 may be selected from any of the several known configurations for effecting two phase charge transfer in a charge transfer device. For example, see Sequin and Tompsett, "Charge Transfer Devices", Academic Press, Inc. 1975.

An adjacent pair of charge transfer electrodes form a unit cell of the charge transfer device. One cell labelled 113 is indicated by dotted lines in FIG. 1. A pair of output contacts 114 and 116 are provided to the upper and lower channels, respectively.

An array of subtractive color filter elements 118 is disposed over the dual superposed channel charge transfer structure 102, each filter element being disposed over one unit cell of the charge transfer device. The array of filter elements 118 is comprised of filters of a first type (yellow) 120 for blocking blue wavelengths of light from the light receiving surface 104, and filters of a second type (cyan) 122 for removing red wavelengths from the incident light. The device according to the invention may further comprise a broad-band cutoff filter 124 which allows only visible wavelengths of light to pass.

In simplified terms, operation of the hybrid image sensor shown in FIG. 1 can be described as follows. Due to the differential absorption of light by a semiconductor material, the upper channel 106 of the multiple superposed channel semiconductor structure 102 may be constructed to possess an intrinsic spectral sensitivity predominent in the shorter and intermediate wavelengths regions, e.g. blue and green. The lower channel 108 may be configured to possess an intrinsic spectral sensitivity predominant in intermediate and longer wavelengths, e.g. green and red. The upper and lower channels are configured to possess substantially equal sensitivities to green. Since a yellow subtractive filter removes the blue component from light impinging on the light receiving surface 104 of the semiconductor device, the upper channel of a unit cell disposed beneath a yellow filter element will produce a photosignal S1 corresponding to the green component of incident light. The lower channel will be responsive to incident light to produce a signal S2 representative of the green and red components of the incident light. If the signal S1 is subtracted from the signal S2, a signal predominantly representing the red component of incident light is produced.

The cyan filter elements remove the red components from incident light. The upper channel of a unit cell disposed beneath a cyan filter element responds to incident light to produce a photosignal S3 representative of the blue and green components of the incident light. The lower channel of such a unit cell responds to incident light to produce a photosignal S4 representing predominantly the green component of the incident light. If signal S4 is subtracted from signal S3, a signal representing predominantly the blue component of the incident light is produced. Accordingly, each unit cell of the hybrid color imaging array produces a photosignal representing the green component of incident light, the color component in which the human visual system is most able to distinguish fine detail. Every other cell of the array produces a photosignal from which either a red or blue component of incident light may be derived, color components for which a relatively lower spatial resolution suffices for human viewing.

A broad-band cut-off filter 124 which passes only visible wavelengths of incident radiation may be placed over the device to further improve its response. Optimum signal processing for producing the three color signals from the two channels is, of course, not quite as simple as subtracting one signal from the other, but employs well-known matrixing procedures, described below, to optimize the signal separation. It should be further noted that the relative proportions of cyan and yellow filters may be other than equal as shown in FIG. 1 to further tailor the output of the device to the human visual system. For example, since the human eye is better able to distinguish detail illuminated by red light than that illuminated by blue light, more yellow filters than cyan filters may be provided in the array.

Photosignals generated by the hybrid image sensing device are periodically read out by applying a two phase transfer signal, P1, P2, to transfer electrodes 110, 112 to move the photosignals in their respective channels to output contacts 114 and 116.

Figure 2:
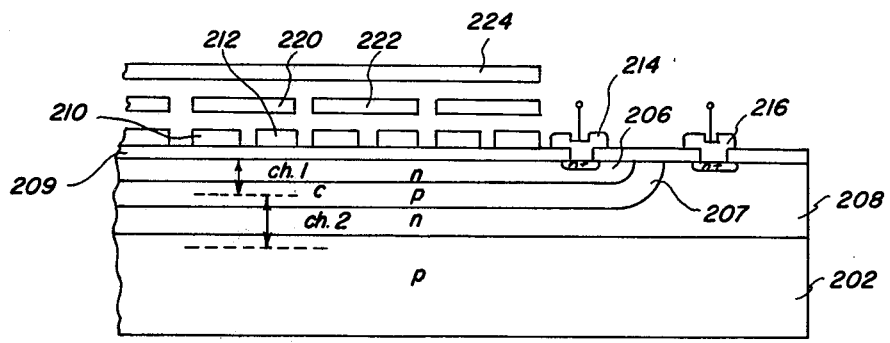
FIG. 2 is a longitudinal cross-section of a portion of a hybrid color image sensing array according to a presently preferred embodiment of the invention.

FIG. 2 illustrates a presently preferred configuration for the dual superposed channel structure of the hybrid image sensing array. The channel structure is formed on a p-type silicon substrate 202 over which an n-type layer of silicon 208 is epitaxially formed. A p-type layer 207 is formed, preferably by diffusion, in epitaxial layer 208 and an n-type layer 206 is formed, preferably by ion implantation, in p-type layer 207. A gate oxide layer 209 is provided over the surface of the device. Two-phase electrodes 210, 212 are disposed on the gate oxide and windows are provided in the oxide for contacts 214 and 216. The contacts comprise strongly doped islands in the n-type layers 206 and 208, respectively. Subtractive filter elemtents 220 and 222 are disposed over the unit cells of the shift register and a broad-band cut-off filter 224 is disposed over the optically active area of the device.

Figure 3A:
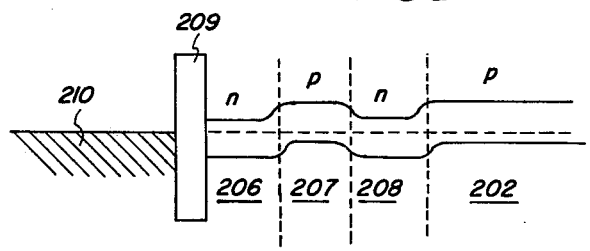
FIG. 3a is a qualitative energy band diagram of the channel structure of FIG. 2, shown in an unbiased condition.
Figure 3B:
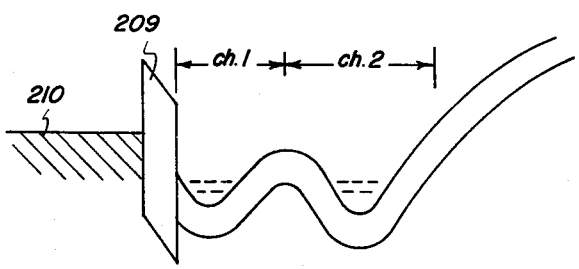
FIG. 3b is a qualitative energy band diagram of the channel structure of FIG. 2, shown in a biased condition.
Figure 4:
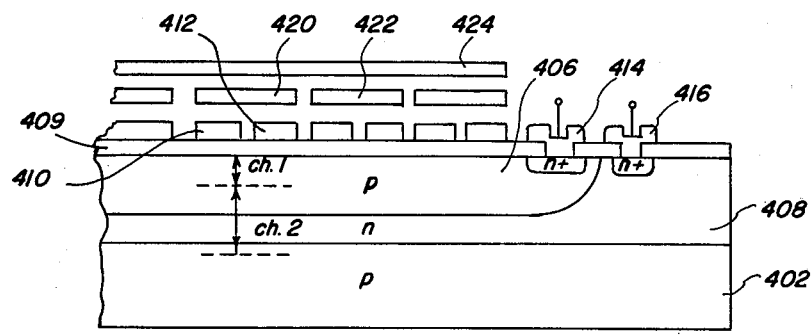
FIG. 4 is a longitudinal cross-section of a portion of a hybrid color image sensing array according to the present invention showing an alternative channel structure.

FIG. 3a is a qualitative energy band diagram of the device shown in FIG. 2 in its unbiased state. FIG. 3b is a qualitative energy band diagram showing the device in its biased condition and indicating the relative positions of the upper channel (channel 1) and the lower channel (channel 2). Photocharges, represented by electrons gererated in channel 1 and in channel 2 are carried in the respective n-type layers 206, 208. A device utilizing holes as signal carriers would be provided by reversing the dopant types of the respective layers. In the configuration shown in FIG. 2, both the upper and lower channels, channel 1 and channel 2, are bulk or buried channels. Alternatively, a multiple superposed channel structure may be provided having fewer semiconductor layers than the device shown in FIG. 2 by making the upper channel, channel 1, a surface channel. FIG. 4 illustrates the configuration of a charge transfer device having a surface channel and a buried channel. The multiple superposed channel structure is formed on a p-type silicon substrate 402 over which an epitaxially grown layer of n-type silicon 408 is formed. An ion implanted or diffused layer of p-type silicon 406 is formed in the n-type layer 408 to complete the structure. A gate oxide layer 409 is provided over the surface of the device. Windows for contacts 414 and 416 are provided in the oxide, and the contacts are formed by highly doped n-type regions. Transfer electrode structures 410 and 412 are disposed on the surface of the insulating layer. The subtractive color filters represented by 420 and 422 are disposed over the unit cells of the charge transfer device and a broad-band cut-off filter 424 is disposed over the active area of the device.

Figure 5A:
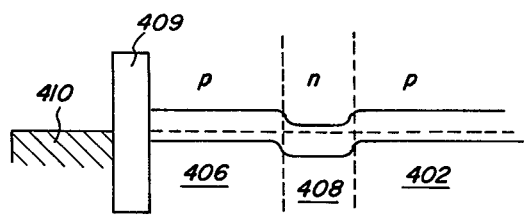
FIG. 5a is a qualitative energy band diagram of the alternative channel structure of FIG. 4, shown in an unbiased condition.
Figure 5B:
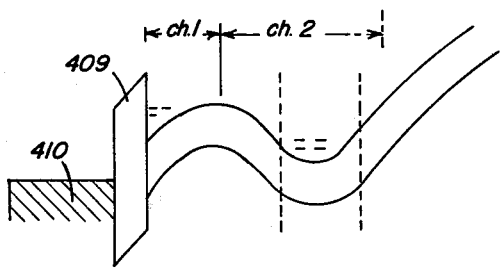
FIG. 5b is a qualitative energy band diagram of the alternative channel structure of FIG. 4, shown in a biased condition.

FIG. 5a is a qualitative energy band diagram of the device shown in FIG. 4 in an unbiased condition. FIG. 5b is a qualitative energy band diagram of the device shown in FIG. 4 in a biased condition. As can be seen from FIG. 5b, channel 1 extends from the surface of the device to somewhere within the p-type layer 406. Channel 2 extends from the bottom of channel 1 through n-type layer 408 to somewhere within the p-type layer 402.

Figure 6A:
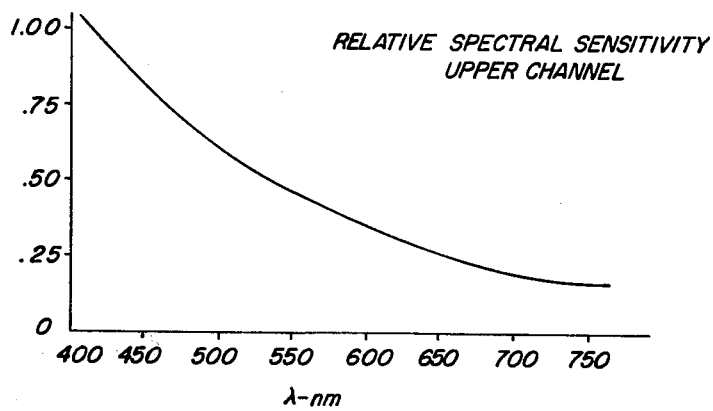
FIGS. 6a through f are somewhat idealized plots of relative channel sensitivities and filter transmittances for the elements comprising a preferred embodiment of the invention.
Figure 6B:
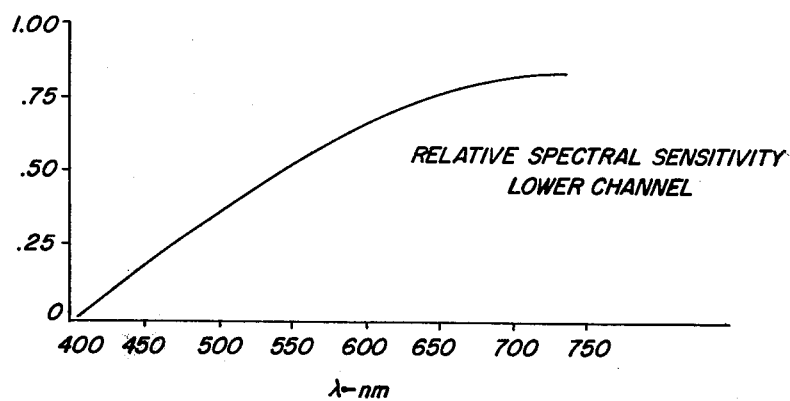

The absorption coefficient $\alpha(\lambda)$ of silicon varies between $5 \times 10^4$ cm$^{-1}$ at 400 nm, to $3 - 10^3$ cm$^{-1}$ at 600 nm. If the boundary between the upper and lower channels of the devices just described is at a depth "d" below the light receiving surface of the device, the intrinsic sensitivity of the upper channel will be $1 - e^{-\alpha(\lambda)d}$ and that of the lower channel will be $e^{-\alpha(\lambda)d}$. Assuming that all the incident light not absorbed in the upper channel will be absorbed in the lower channel it has been found that a depth $d = 1$ μm yields upper and lower channel sensitivities that are approximately equal in the green (550 nm) region of the spectrum. The resulting relative spectral sensitivity for the upper channel is shown in FIG. 6a and the relative spectral sensitivity for the lower channel is shown in FIG. 6b.

Figure 6C:
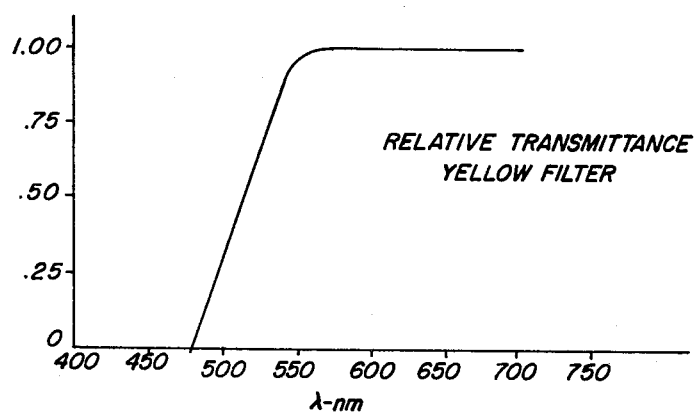
Figure 6D:
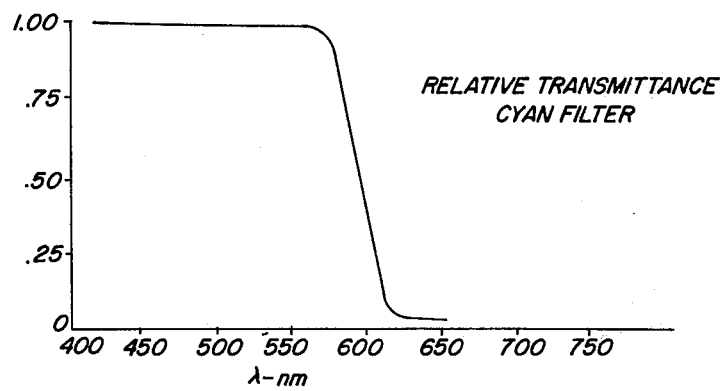
Figure 6E:
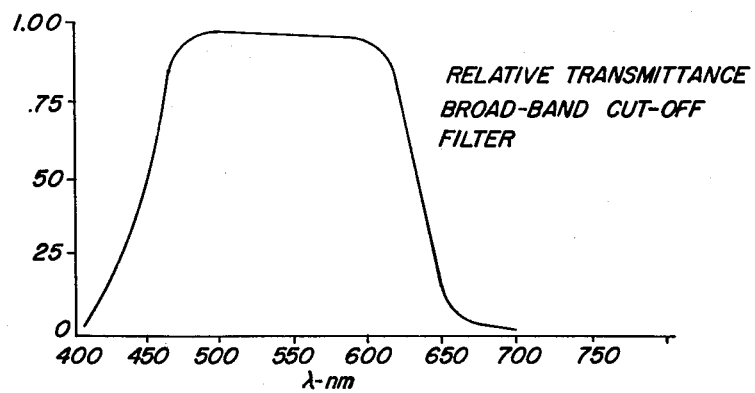

When it is desired that the upper channel produce a signal primarily representative of the green component of incident light and the lower channel produce a signal from which the red component of incident light may be derived, a yellow filter having the relative transmittance shown in FIG. 6c is disposed over the photosensitive element. When it is desired that the lower channel provide a photosignal representing the green component of incident light and the upper channel produce a photosignal from which the blue component of incident light may be derived, a cyan filter having relative transmittance characteristics shown in FIG. 6d is provided over the photosensitive element. Ideally, the blue sensitivity of the hybrid image sensor should peak near 450 nm and red sensitivity should peak near 600 nm. To acomplish, this, a broad-band cut-off filter having the relative transmittance characteristics shown in FIG. 6e is disposed over the active area of the device. With all the filters in place, the respective channel spectral sensitivities appear as shown in FIG. 6f.

Figure 6F:
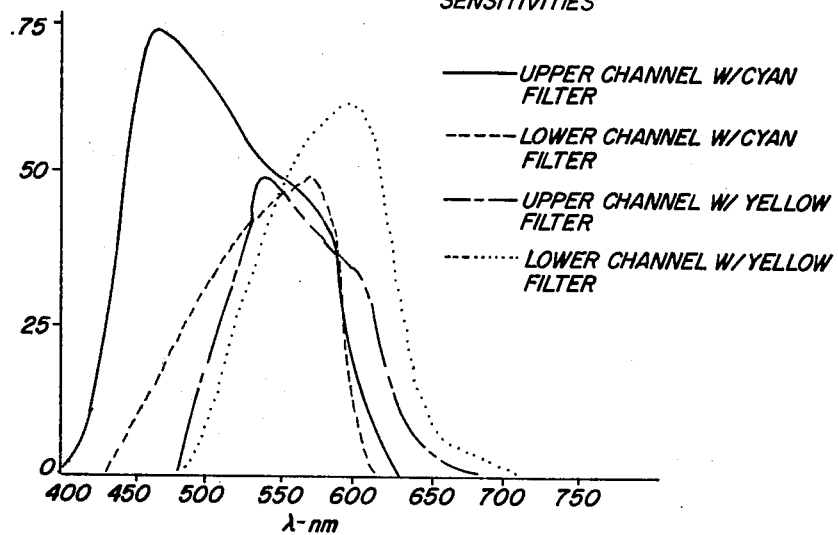

As can be seen from FIG. 6f, the respective channel spectral sensitivities provide sufficient color separation such that when the signals produced by the respective channels are properly processed, employing well-known color correction matrixing techniques, good quality color reproduction may be achieved.

Figure 7:
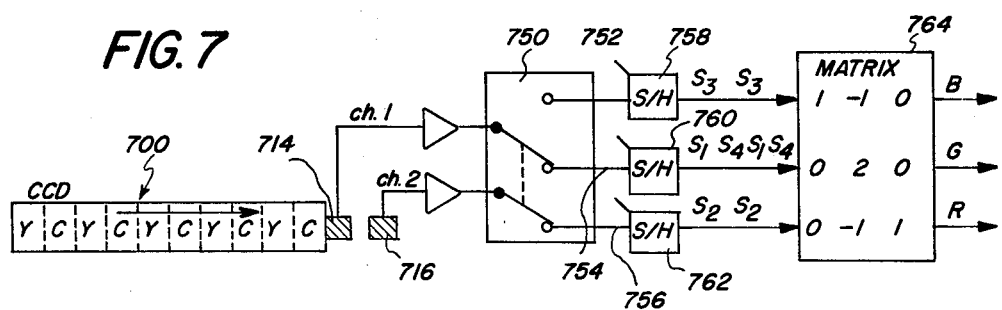
FIG. 7 is a schematic diagram showing the readout organization of a linear hybrid color image sensor according to the invention wherein photosignals are generated in the charge transfer channel of a linear CCD.

FIG. 7 illustrates one possible readout scheme for a hybrid color image sensor according to the present invention. The hybrid color image sensor generally designated 700 is configured as a linear CCD wherein photocharges are accumulated within the charge transfer cells of the CCD. When the CCD is suitably clocked, the photosignals from channel 1 and channel 2 are serially transferred to output contacts 714 and 716, respectively. After appropriate amplification, the signals from the two channels are assigned by a switching circuit 750 to three output lines 752, 754 and 756. The signals appearing at the output lines are sampled and held by sample and hold circuit 758, 760 and 762. A suitable matrix 764 performs a linear transformation on the signals to produce a set of three color output signals (blue, green and red).

Figure 8:
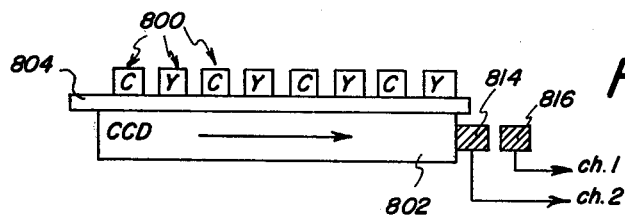
FIG. 8 is a schematic diagram of an alternative readout configuration for a linear color image sensor according to the invention wherein photosignals are generated in separate light integration sites and transferred to an adjacent linear CCD for readout.

An alternative readout scheme is shown in FIG. 8 wherein photosignals are accumulated in separate multiple superposed channel image sensing sites 800 from which they are transferred, in parallel, to a multiple superposed channel CCD device 802 by a transfer gate 804. The photosignals from channel 1 and channel 2 are transferred within the CCD to output contacts 814 and 816, respectively. The output signals are processed in a manner similar to that shown in FIG. 7.

Figure 9:
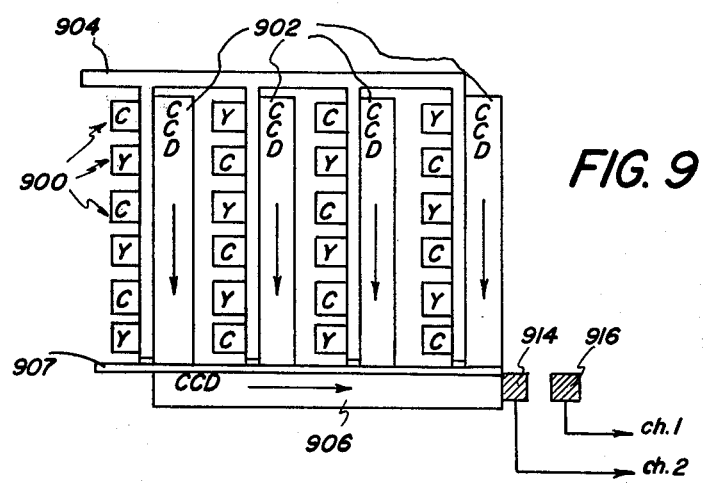
FIG. 9 is a schematic diagram of an area color image sensor, of the interline transfer type, configured according to the invention.

A hybrid image sensing array of the interline transfer type is shown in FIG. 9. Photosignals generated in individual multiple superposed sensing sites 900 are transferred into a plurality of vertical interline CCD devices 902 by transfer gates 904. The photosignals from each line are then transferred to a horizontal CCD device 906 by transfer gate 907. The photosignals are shifted to output gates 914 and 916 to be processed in a manner similar to that shown in FIG. 7.

The invention has been described in detail with particular reference to preferred embodiments thereof and it will be understood that variations and modifications may be effected within the spirit and scope of the invention. For instance, the dual superposed channel structure may comprise a surface channel for collecting carriers of one polarity and a buried channel for collecting carriers of opposite polarity, such as the dual superposed channel structure disclosed in U.S. Pat. application Ser. No. 959,830 filed Nov. 13, 1978 in the name of Burkey et al.

We claim:
1. A hybrid color image sensing array, comprising:
   (a) an array of semiconductor image sensing elements, at least some of which elements having superposed upper and lower light responsive channels for producing first and second photosignals, the intrinsic spectral responses of said upper and lower channels being different due to the differential absorption of light by a semiconductor material; and
   (b) an array of color filter elements disposed over the array of image sensing elements, the array of filter elements having;
      (1) elements having a first relative transmittance adapted to tailor the spectral responses of an image sensing element such that the photosignals produced by the element possess a component representing the response of the element to light in a first spectral region and a component representing the response of the element to light in a second spectral region, and
      (2) elements having a second relative transmittance adapted to tailor the spectral responses of an image sensing element such that the photosignals produced by the element posssess a component representing the response of the element to light in said first spectral region and a component representing the response of the element to light in a third spectral region.

2. The invention claimed in claim 1 further comprising: a broad-band cut-off filter, adapted to pass only visible light, disposed over said array of image sensing elements.

3. The invention claimed in claim 1, further comprising: matrixing means responsive to said first and second photosignals for producing a relatively high resolution signal representing said first spectral region and two relatively lower resolution signals representing said second and third spectral regions, respectively.

4. The invention claimed in claim 1, further comprising: dual superposed channel CCD shift register means for moving said first and second photosignals.

5. In a solid-state, semiconductor device comprised of semiconductor material having a light receiving surface, an image sensing array comprising:
   (a) an array of photosensitive elements, each element having;
      (1) first channel means for collecting a first photosignal generated in response to light falling on said light receiving surface, in a first region extending to a first depth, with respect to said surface, within said semiconductor material, said first channel means having a first predetermined spectral response to first, second and third wavelength ranges of light; and
      (2) buried channel means, disposed more remote from said surface than said first channel means for collecting a second photosignal generated, in response to light falling on said light receiving surface, in a second region extending to a second depth, greater than said first depth, within said semiconductor material, said buried channel means having a second predetermined spectral response different from said spectral response of said first channel due to the differential absorption of light by the semiconductor, said second response being substantially less than, substantially similar to, and substantially greater than said first response to said first, second and third wavelength ranges, respectively, said first and second photosignal generating regions being superposed within said element; and
   (b) an array of filter elements disposed over said array of photosensitive elements, said filter element array having elements of a first type adapted to transmit substantially all of said first and second and substantially none of said third wavelength ranges of light and elements of a second type adapted to transmit substantially all of said second and third substantially none of said first wavelength ranges of light.

6. The invention claimed in claim 5, wherein said first depth is approximately equal to 1 $\mu$m.

7. The invention claimed in claim 5, further comprising: a broad-band cut-off filter disposed over said array of photosensitive elements, said broad-band cut-off filter being adapted to pass only said first, second and third wavelength ranges of light.

8. The invention claimed in claim 5 wherein said first, second and third wavelength ranges of light correspond to blue, green and red wavelengths, respectively.

9. In a semiconductor imaging device for producing color image signals, and imaging array comprising:
   (a) an array of multiple superposed channel image sensing elements, at least some of said elements having;
      (1) a first channel responsive primarily to blue and green wavelengths of light for producing a first photosignal; and
      (2) a second channel responsive primarily to green and red wavelengths of light for producing a second photosignal; and
   (b) an array of cyan and yellow filter elements disposed over said array of image sensing elements, whereby said first and second photosignals from an image sensing element disposed beneath a cyan filter element represent (1) blue plus green and (2) green light, respectively, and said first and second photosignals from an image sensing element disposed beneath a yellow filter represent (1) green and (2) green plus red light, respectively.

10. The imaging device claimed in claim 9 further comprising: signal processing means responsive to said first and second photosignals for producing three signals representing blue, green and red, respectively.

11. The imaging device of claim 9, further comprising: a bandpass filter disposed over said array of photosensitive elements and adapted to pass only visible wavelengths of light.

12. A solid-state color image sensing array, comprising:
   (a) a semiconductor substrate having a light receiving surface,
   (b) a plurality of photosensitive elements at least some of said elements having;
      (1) a first photosignal generating channel extending from said surface to a first depth within said semiconductor substrate and being primarily responsive to blue and green wavelengths of light due to the differential absorption of light by the semiconductor material; and
      (2) a second photosignal generating channel disposed beneath said first channel a second distance from said light receiving surface and primarily responsive to green and red wavelengths of light due to the differential absorption of light by the semiconductor material; and (c) a filter array having at least one cyan filter element disposed over at least one of said photosensitive elements and at least one yellow filter element disposed over at least another one of said photosensitive elements.

13. A solid-state color image sensing array of the type having an array of filters disposed over an array of semiconductor photosensitive elements, characterized by: said array of photosensitive elements having superposed upper and lower light responsive channels for generating first and second photosignals, the intrinsic spectral responses of said upper and lower channels being different due to the differential absorption of light by a semiconductor material; and said array of color filter elements having elements of a first relative transmittance type adapted to tailor the spectral responses of an image sensing element such that the photosignals produced thereby possess a component representing the response of the element to light in a first spectral region and a component representing the response of the element to light in a second spectral region, and elements of a second relative transmittance type adapted to tailor the spectral responses of an image sensing element such that the photosignals produced thereby possess a component representing the response of the element to light in said first spectral region and a component representing the response of the element to light in a third spectral region.

14. A hybrid color image sensing array, comprising:
(a) an array of semiconductor image sensing elements, at least some of said elements having superposed upper and lower light responsive channels for producing first and second photosignals. The intrinsic spectral responses of said upper and lower channels being different due to the differential absorption of light by a semiconductor material; and
(b) a filter array having at least one filter element of a first type disposed over at least one of said image sensing elements, said filter element of said first type having a first relative transmittance adapted to tailor the spectral responses of an image sensing element such that the photosignals produced by the element possess a component representing the response of the image sensing element to light of a first color and a component representing the response of the image sensing element to light of a second color, and at least one filter element of second type disposed over at least another one of said image sensing elements, said filter element of said second type having a second relative transmittance adapted to tailor the spectral responses of an image sensing element such that the photosignals produced by the element possess a component representing the response of the element to light of said first color and a component representing the response of the element to light of a third color.

* * * * *